(12) United States Patent
Daniel et al.

(10) Patent No.: US 7,095,483 B2
(45) Date of Patent: Aug. 22, 2006

(54) PROCESS INDEPENDENT ALIGNMENT MARKS

(75) Inventors: David W. Daniel, Vancouver, WA (US); James R. B. Elmer, Vancouver, WA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 11/000,772

(22) Filed: Dec. 1, 2004

(65) Prior Publication Data
US 2005/0078289 A1    Apr. 14, 2005

Related U.S. Application Data

(62) Division of application No. 09/887,131, filed on Jun. 22, 2001, now Pat. No. 6,856,029.

(51) Int. Cl.
*G03B 27/42* (2006.01)
*G03B 27/58* (2006.01)
*G03B 27/62* (2006.01)
*G01B 11/00* (2006.01)
*G03B 27/54* (2006.01)

(52) U.S. Cl. .............................. 355/53; 355/72; 355/75; 355/67; 356/399

(58) Field of Classification Search ................ 355/53, 355/72, 75, 67; 356/399, 400, 401
See application file for complete search history.

(56) References Cited

U.S. PATENT DOCUMENTS

| 5,874,190 A * | 2/1999 | Tanaka ......................... 430/22 |
| 6,309,943 B1* | 10/2001 | Glenn et al. ................. 438/401 |
| 6,525,805 B1* | 2/2003 | Heinle ......................... 355/53 |
| 6,529,625 B1* | 3/2003 | Sentoku et al. ............. 382/151 |

FOREIGN PATENT DOCUMENTS

JP    1-164032    *    6/1989

* cited by examiner

*Primary Examiner*—Peter B. Kim
(74) *Attorney, Agent, or Firm*—Luedeka, Neely & Graham

(57) ABSTRACT

An apparatus for aligning a mask having an image and at least one complimentary alignment mark to a substrate having a first surface and a substantially opposing second surface. The substrate further has at least one alignment mark on the second surface. A mask support supports the mask in proximity to the first surface of the substrate. A substrate support supports the substrate with the first surface in proximity to the mask. An alignment means aligns the at least one alignment mark on the second surface of the substrate to the at least one complimentary alignment mark on the mask. An exposure source projects the image of the mask onto the first surface of the substrate, and a controller controls the mask support, substrate support, alignment means, and exposure source.

7 Claims, 2 Drawing Sheets

PROCESS INDEPENDENT ALIGNMENT MARKS

This is a divisional application of U.S. patent application Ser. No. 09/887,131 filed Jun. 22, 2001, now issued as U.S. Pat. No. 6,856,029.

FIELD

This invention relates to the field of integrated circuit processing. More particularly the invention relates to aligning layers of an integrated circuit to a substrate during integrated circuit processing.

BACKGROUND

Multiple layers are built upon a substrate during the fabrication of an integrated circuit. These layers define various electrical structures of the integrated circuit. The alignment of the layers requires accuracy and precision. Typically, alignment marks are included in one or more of the initial layers, and the masks for the subsequent layers are aligned to these alignment marks. Thus, the accuracy of the alignment tends to be dependent upon the clarity and accuracy of the alignment marks. As layers of the integrated circuit are built up, etched, polished, and removed, the alignment marks might be completely removed, significantly altered, or covered during the fabrication of the integrated circuit. As a result, the subsequent layers of the integrated circuit may be misaligned as the alignment marks are changed during processing. Even the slight misalignment of a layer during the fabrication of the integrated circuit can cause one or more components of the integrated circuit to malfunction. Thus, misalignment of a layer tends to reduce the process yield and increase the cost of the integrated circuits. Moreover, misalignment of a layer can create device reliability issues.

What is needed, therefore, is a system for reliably aligning the various layers of an integrated circuit to a substrate.

SUMMARY

The above and other needs are met by an integrated circuit substrate having a first surface for receiving a series of aligned layers during the creation of the integrated circuit, and a second surface disposed substantially opposite the first surface, where the second surface has at least one alignment mark for aligning the series of aligned layers one to another during the creation of the integrated circuit.

By placing an alignment mark on the back of the substrate in this manner, the various layers created on the front of the substrate do not hide or destroy the alignment mark. In this manner, the integrity of the alignment mark is preserved throughout the processing the integrated circuit, and the layers are all aligned to the same alignment mark.

In another aspect the invention provides for an apparatus for aligning a mask having an image and at least one complimentary alignment mark to a substrate having a first surface and a substantially opposing second surface. The substrate further has at least one alignment mark on the second surface. A mask support supports the mask in proximity to the first surface of the substrate. A substrate support supports the substrate with the first surface in proximity to the mask. An alignment means aligns the at least one alignment mark on the second surface of the substrate to the at least one complimentary alignment mark on the mask. An exposure source projects the image of the mask onto the first surface of the substrate, and a controller controls the mask support, substrate support, alignment means, and exposure source.

Thus, an apparatus according to the present invention aligns a mask to an alignment mark on the back side of the substrate, rather than aligning the mask to an alignment mark on the front side of the substrate, as is currently done.

In a first preferred embodiment, the alignment means has a first sensor for detecting the at least one alignment mark on the second surface of the substrate, and for producing an image of the at least one alignment mark. A second sensor detects the at least one complimentary alignment mark on the mask, and produces an image of the at least one complimentary alignment mark. A compositor visibly overlays the image of the at least one alignment mark and the image of the at least one complimentary alignment mark. Movement controls move at least one of the substrate support and the mask support relative to the other, and align the image of the at least one alignment mark to the image of the at least one complimentary alignment mark.

In a second preferred embodiment, the alignment means has a projection means for projecting an image of the at least one alignment mark through the substrate. A sensor detects the image of the at least one alignment mark projected through the substrate, and also detects an image of the at least one complimentary alignment mark on the mask. Movement controls move at least one of the substrate support and the mask support relative to the other, and align the image of the at least one alignment mark projected through the substrate to the image of the at least one complimentary alignment mark.

In yet another aspect, the invention provides for a method for aligning a mask having an image and at least one complimentary alignment mark to a substrate having a first surface and a substantially opposing second surface. The substrate also has at least one alignment mark on the second surface. A mask is disposed in proximity to the first surface of the substrate. An image of the at least one alignment mark is created, as is an image of the at least one complimentary alignment mark. At least one of the mask and substrate is moved relative to the other, and the image of the least one alignment mark is aligned to the image of the at least one complimentary alignment mark. The image of the mask is projected onto the first surface of the substrate.

In a first preferred embodiment of the method, the images are created by detecting the at least one alignment mark on the second surface of the substrate, and producing an image of the at least one alignment mark. The at least one complimentary alignment mark on the substrate is also detected, and an image of the at least one complimentary alignment mark is also created. The image of the at least one alignment mark and the image of the at least one complimentary alignment mark are visibly over laid. Thus, in this embodiment two sensed images, one of the alignment mark on the back of the substrate and another on the mask, are composited and aligned one to the other.

In a second preferred embodiment of the method, the images are created by projecting an image of the at least one alignment mark through the substrate. The image of the at least one alignment mark projected through the substrate is detected with at least one sensor. An image of the at least one complimentary alignment mark on the mask is also detected with the at least one sensor. Thus, in this embodiment there is a single sensed image of the alignment mark on the mask and the alignment mark from the back of the substrate that is projected through the substrate.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
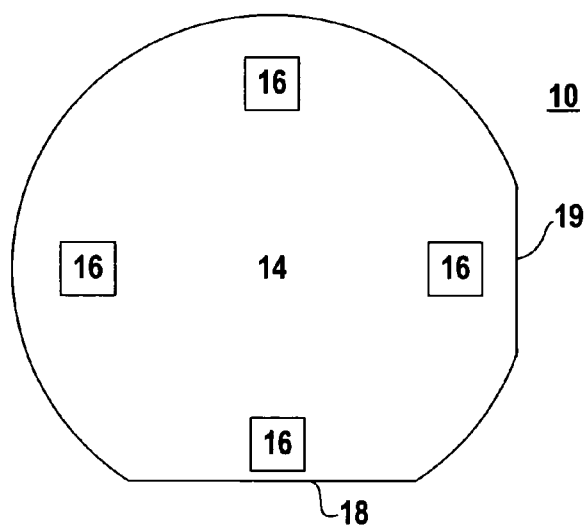
FIG. 1 is a top plane view of a substrate according to the present invention.

Referring now to FIG. 1, there is depicted a substrate 10 according to the present invention. The substrate 10 may be formed of any one or more of a variety of different materials. If the integrated circuit to be formed on the substrate 10 is a semiconducting device, then the substrate 10 may be formed of a semiconducting material such as silicon, germanium, gallium arsenide, some other III–V compound, or other such material or combination of materials. If the integrated circuit is not a semiconducting device, then the substrate may be one or more of an even greater number of materials, such as alumina, sapphire, other ceramic, or glass.

The substrate 10 has a first surface 12, not depicted in FIG. 1, and a substantially opposing second surface 14. The first surface 12 is the side of the substrate 10 that will be used to create the integrated circuits on the substrate 10, and the second surface 14 is the back side of the substrate 10. The substrate 10 also preferably includes at least one alignment mark 16. As depicted in FIG. 1, four alignment marks 16 are disposed in different quadrants of the second surface 14 of the substrate 10. However, it is appreciated that this depiction is for the sake of example only, and that in alternate embodiments a fewer number of alignment marks 16 may be used, such as one or two, or a greater number of alignment marks 16 may be used. For example, if a very high degree of accuracy is desired in the alignment process, than a very large number of alignment marks 16 may be used, such as sixteen or even more. Further, the positions of the alignment marks 16 on the second surface 14 of the substrate 10 as depicted in FIG. 1 is also representational.

However, it is preferred that the position of the alignment marks 16 on the second surface 14 of the substrate 10 be known, and that the alignment marks 16 be placed in these known positions with at least a fair degree of precision. In other words, it is preferred that the alignment marks 16 be located in substantially the same known position on each of the substrates 10 according to the present invention. By placing the alignment marks 16 in substantially the same position on each substrate 10, additional benefits of the present invention may be realized, as explained in more detail below.

The substrate 10 also preferably includes other features for the rough alignment of the substrate 10, such as a major flat 18 and a minor flat 19. The major flat 18 and minor flat 19 can be used during processing to automatically orient the substrate 10 to a given position. This capability is exploited by the various embodiments of the present invention, as described in more detail below.

The alignment marks 16 are preferably etched or laser scribed into the second surface 14 of the substrate 10, in such a manner that the alignment marks 16 do not extend to any appreciable extent past the plane of the second surface 14 of the substrate 10. In this manner a variety of benefits are realized. First, because of the relief nature of the alignment marks 16, the alignment marks 16 tend to be relatively permanent, in that they are not obliterated by the various processes that the substrate 10 is exposed to during creation of the integrated circuits. Further, and again because of the relief nature of the alignment marks 16, the substrate 10 is able to lie substantially flat on its second surface 14 against a platen or other such receptacle. The ability for a substrate 10 to lie flat on a platen is relatively important, as this ability tends to affect heat transfer and other physical parameters of the substrate 10 during processing.

In alternate embodiments, the alignment marks 16 are formed such as by printing on the second surface 14 of the substrate 10. The printing is preferably of a material that is not substantially effected by the processing that the substrate 10 receives during the formation of the integrated circuits. Most preferably the printing is not applied to a thickness that prohibits the substrate 10 from lying substantially flat against a platen, for the reasons as described above.

Figure 2:
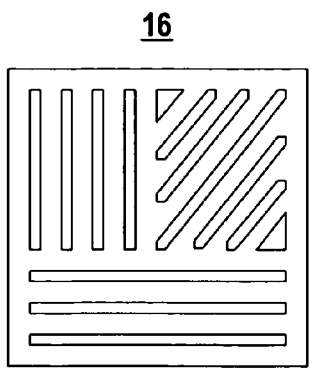
FIG. 2 is a first embodiment of an alignment mark according to the present invention.
Figure 3:
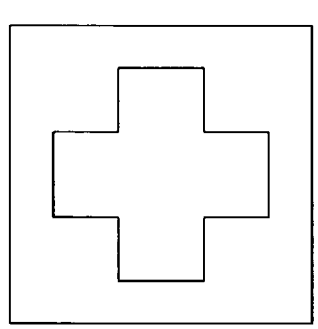
FIG. 3 is a second embodiment of an alignment mark according to the present invention.
Figure 4:
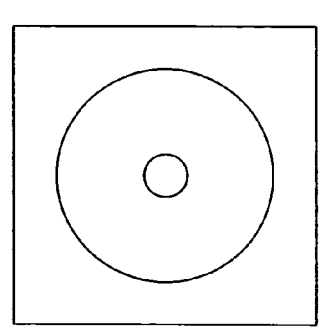
FIG. 4 is a third embodiment of an alignment mark according to the present invention.

The alignment marks 16 preferably include a variety of geometric shapes, that are arranged in a variety of patterns, as given in FIGS. 2–4. As depicted in FIG. 2, the geometric shapes preferably have orientations in several different directions, such as horizontal, vertical, and diagonal. The shapes used for the alignment marks 16 preferably lend themselves well to the alignment of complimentary alignment marks, as described in more detail below. For example, the cross shaped alignment mark 16 of FIG. 3 may be readily aligned to a complimentary alignment mark that is also in the shape of a cross, which complimentary alignment mark is slightly smaller than the alignment mark 16 of FIG. 3, and which complimentary alignment mark fits inside of the cross shaped alignment mark 16 of FIG. 3.

Alternately, the complimentary alignment mark designed to work in conjunction with the cross shaped alignment mark 16 of FIG. 3 may be a set of four boxes in an orthogonal pattern, which are sized to fit into the four corners of the alignment mark 16 of FIG. 3. In a similar manner, the complimentary alignment mark designed to work with the annular circles of the alignment mark 16 of FIG. 4 may be a circle designed to fit within the two circles of the alignment mark 16 of FIG. 4. Thus, it is appreciated that many different geometric shapes may be used for the alignment marks 16, and that there are likewise many shapes for the complimentary alignment marks that are to be used in conjunction with the alignment marks 16, as described below.

By placing the alignment marks 16 on the second surface 14 of the substrate 10 in the manner as described above, the alignment marks 16 tend to not be obliterated or otherwise altered as the various layers required to form the integrated circuit are deposited, etched, polished, and removed from the first surface 12 of the substrate 10. In this manner, the various layers of the integrated circuit can all be aligned to the same alignment marks 14, which tends to reduce any drift in the alignment of the various layers as the processing of the integrated circuit is accomplished.

Figure 5:
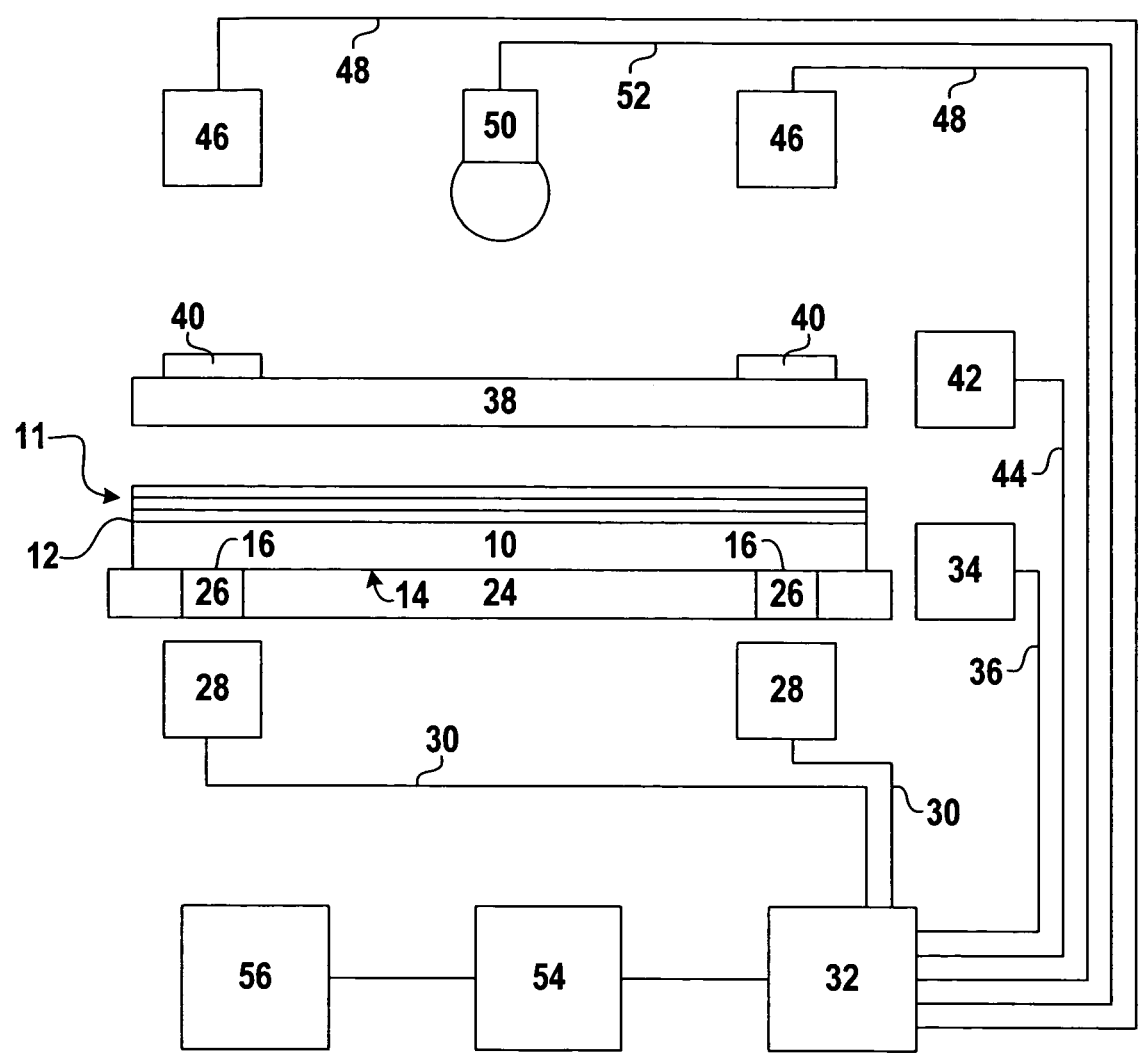
FIG. 5 is functional block diagram of an apparatus according to the present invention.

An apparatus 20 for aligning the various layers of the integrated circuit on the substrate 10 is functionally depicted in FIG. 5. The apparatus 20 is in many ways similar to the aligners or steppers presently used to pattern integrated circuits in the semiconductor industry and other industries. However, there are some very notable differences between the apparatus 20 of the present invention and prior art aligners and steppers. The discussion below focuses primarily on these differences rather than on the similarities. Thus, it is appreciated that there are many components of the apparatus 20 which are not described in detail below, because these components are understood in the industry. Therefore, for the sake of clarity and highlighting the novelty of the apparatus 20, the discussion below is limited to those aspects of the apparatus 20 that are more a part of the novel aspects of the present invention.

The substrate 10 is received by the apparatus 20 by a substrate support 24, such as a platen, as depicted in FIG. 5. The substrate support 24 preferably holds the substrate 10 in positions that are known to the apparatus 20. In other words, the apparatus 20 is able to move the substrate 10 in a desired manner by either moving the substrate support 24 or by moving other components of the apparatus 20 relative to the substrate support 24. This function is described in more detail hereafter.

The substrate 10 is oriented on the substrate support 24 with the second surface 14 of the substrate 10 adjacent the substrate support 24. Thus, the alignment marks 16 on the second surface 14 of the substrate 10 are adjacent the substrate support 24. Most preferably, the substrate 10 is rough aligned before it is positioned on the substrate support 24. This is preferably accomplished by rotating the substrate 10 on a component such as a chuck, while sensing the location of one or both of the major flat 18 and the minor flat 19. By determining the location of one or both of these flats 18 and 19, the substrate 10 can be placed on the substrate support 24 in a relatively known orientation. The benefits of placing the substrate 10 on the substrate support 24 in a know orientation are explained in more detail below.

As mentioned above, the substrate 10 is preferably received by the substrate support 24 with the second surface 14 of the substrate 10 adjacent the substrate support 24. Thus, depending upon the specific configuration of the substrate support 24, the alignment marks 16 on the second surface 14 of the substrate 10 may be hidden or otherwise covered by the substrate support 24. In those embodiments where the substrate support 24 does cover or obscure the alignment marks 16, various preferred embodiments of the elements described above are useful in enabling the alignment marks 16 to be viewed.

As described above, the alignment marks 16 are preferably placed in substantially the same position, substrate to substrate, on the second surface 14 of the substrates 10. Also as described above, the substrate 10 is preferably placed on the substrate support 24 in a known orientation. With a fore knowledge of the location of the alignment marks 16 and the orientation of the substrate 10, the substrate support 24 can be configured so as to not hide the alignment marks 16. This capacity is exemplified in FIG. 5 by view ports 26, which are formed in the platen that depicts the substrate support 24. Preferably, the view ports 26 directly underlie the alignment marks 16. The view ports 26 are preferably sized so that the entire alignment mark 16 can be viewed through the view port 26, given the positioning tolerance of placing the alignment mark 16 on the second side 14 of the substrate 10 and the orientation tolerance of placing the substrate 10 on the substrate support 24.

The substrate 10 is received by the apparatus 20 with the first surface 12 of the substrate 10 disposed in proximity to a mask 38. The mask 38 includes an image, which image is used to pattern a given layer on the first surface 12 of the substrate 10, in a manner as known in the art. The mask 38 may include the images necessary to pattern the entire substrate 10 with a single exposure, or the mask 38 may be a reticle that is stepped across the first surface 12 of the substrate 10. The mask 38 also preferably includes at least one complimentary alignment mark 40. The complimentary alignment marks 40 are preferably used to align the mask 38 with the substrate 10, by aligning the complimentary alignment marks 40 associated with the mask 38 with the alignment marks 16 associated with the substrate 10. In a most preferred embodiment, the number of complimentary alignment marks 40 on the mask 38 is equal to the number of alignment marks 16 on the second surface 14 of the substrate 10.

Thus, by placing the complimentary alignment marks 40 in a known position relative to the image or images on the mask 38, and placing the alignment marks 16 in a known position relative to the substrate 10, and then aligning the complimentary alignment marks 40 to the alignment marks 16, the various patterned layers of the integrated circuit formed on the first surface 12 of the substrate 10 are all aligned one to another. The preferred methods and means for aligning the complimentary alignment marks 40 and the alignment marks 16 one to another are described in more detail below.

The mask 38 is preferably supported by a mask support 42, which retains the mask 38 in proximity to the first surface 12 of the substrate 10. The mask support 42 may also include the capacity to move the mask 38 relative to the substrate 10. The ability of the mask support 42 to more the mask 38 relative to the substrate 10 may be used for either one or both of aligning the complimentary alignment marks 40 to the alignment marks 16 and stepping the mask 38 across the first surface 12 of the substrate 10.

The apparatus 20 also has an exposure source 50 for projecting the image of the mask 38 onto the first surface 12 of the substrate 38. Although functionally represented in FIG. 5 by a light bulb, it is appreciated that the exposure source 50 may take one or more of a variety of different forms, such as various wavelengths of ultra violet radiation, x-rays, or gamma rays. The exposure source 50 may also incorporate a laser source for projecting the image of the mask 38. It is appreciated that the exposure source 50 includes other desirable components not further described herein, such as those for shuttering, metering, and calibration of the electromagnetic radiation produced.

In a first preferred embodiment, first sensors 28 detect the alignment marks 16 on the second surface 14 of the substrate 10 through the view ports 26. In various embodiments the first sensors 28 take a variety of different forms, such as lights, mirrors, light pipes, and prisms which optically detect the alignment marks 16 and optically transmit an image of the alignment marks 16. In other embodiments the first sensors 28 are more electronic in nature, such as charge coupled device arrays or video cameras that electronically form an image of the alignment marks 16. It is appreciated that a single first sensor 28 may be used to form images of all of the alignment marks 16, whether there be just one alignment mark 16 or many alignment marks 16 on the second surface 14 of the substrate 10. However, in a preferred embodiment, there is a single first sensor 28 for each alignment mark 16 on the second surface 14 of the substrate 10. Two first sensors 28 are depicted in FIG. 5. However, it is appreciated that there may be many more first sensors 28, to preferably equal a commensurately greater number of alignment marks 16.

In a manner similar to that as described above, second sensors 46 detect the complimentary alignment marks 40 on the mask 38. In various embodiments the second sensors 46 take a variety of different forms, such as lights, mirrors, light pipes, and prisms which optically detect the complimentary alignment marks 40 and optically transmit an image of the complimentary alignment marks 40. In other embodiments the second sensors 46 are more electronic in nature, such as charge coupled device arrays or video cameras that electronically form an image of the complimentary alignment marks 40. It is appreciated that a single second sensor 46 may be used to form images of all of the complimentary alignment marks 40, whether there be just one complimentary alignment mark 40 or many complimentary alignment marks 40 on the mask 38. However, in a preferred embodiment, there is a single second sensor 46 for each complimentary alignment mark 40 on the mask 38.

The various components of the apparatus 20 as described above are preferably in electronic communication with and under the control of a controller 32, such as by communication lines 30, 36, 44, 48, and 52. In this manner, the controller 32 functions to sequence the operation of the various components in proper order, and receive and transmit information between the various components, which information may be necessary or desirable for the proper operation of the apparatus 20, as described generally herein.

In this first preferred embodiment, the mask 38 is aligned to the substrate 10 in the following manner. The first sensors 28 detect and create images of the alignment marks 16 on the second surface 14 of the substrate 10. The images of the alignment marks 16 are transmitted by the first sensors 28 to the controller 32. The controller 32 is able to reference the images of the alignment marks 16 to known positions, because the orientation of the substrate 10 on the substrate support 24 is known, as described above, and the position of the substrate support 24 is also known. The apparatus 20 is calibrated from time to time so that the position of the first sensor 28 is known relative to the substrate support 24. Thus, the controller 32 preferably tracks the relative positions of the images of the alignment marks 16 transmitted by the first sensors 28.

Similar to that as described above, the second sensors 46 detect and create images of the complimentary alignment marks 40 on the mask 38. The images of the complimentary alignment marks 40 are transmitted by the second sensors 46 to the controller 32. The controller 32 is able to reference the images of the complimentary alignment marks 16 to known positions, because the orientation of the mask 38 on the mask support 24 is known, as described above, and the position of the substrate support 24 is also known. The apparatus 20 is calibrated from time to time so that the position of the second sensor 46 is known relative to the mask support 42. Thus, the controller 32 preferably tracks the relative positions of the images of the complimentary alignment marks 46 transmitted by the second sensors 46.

The controller 32 preferably passes the position referenced images of the alignment marks 16 and the complimentary alignment marks 40 to a compositor 54, which overlays the images of the alignment marks 16 with the images of the complimentary alignment marks 40, and presents the composited images, such as on a display 56. It is appreciated that it is not necessary for the composited images to be presented on a display 56, and may instead be presented to some other type of device. The display 56 may be used for manual implementation of the alignment method as described below, or for visual confirmation of an automated alignment method. However, in alternate embodiments an automated alignment method is used without any such visual confirmation as presented on the display 56.

For the sake of clarity, the manual embodiment of alignment, using the display 56, is described herein. Most preferably, the composited images are presented on the display 56 in a split screen, where one alignment mark 16 and one associated complimentary alignment mark 40 are composited in one portion of the screen, and another alignment mark 16 and one associated complimentary alignment mark 40 are composited in another portion of the screen. It is appreciated that in alternate embodiments only one alignment mark 16 and associated complimentary alignment mark 40 are composited and presented on the display 56, and that in further alternate embodiments more than two sets of alignments marks 16 and associated complimentary alignment marks 40 are composited and presented on the display 56.

The concept of what constitutes an association between an alignment mark 16 and a complimentary alignment mark 40 may take different forms. In one embodiment, an alignment mark 16 and a complimentary alignment mark 40 are associated by proximate relative position. For example, an association may be defined between an alignment mark 16 and a complimentary alignment mark 40 that lie substantially on or proximate to a perpendicular line running through the substrate 10. Alternately, an association may be defined between an alignment mark 16 and a complimentary alignment mark 40 that are disposed substantially within or overlie a given portion of the substrate 10, such as a half or a quadrant. In yet a further embodiment, an association may be defined between any alignment mark 16 and complimentary alignment mark 40.

Preferably, when an alignment mark 16 is properly aligned with its associated complimentary alignment mark 40, the image on the mask 38 is properly aligned to the substrate 10. Thus, there are certain spatial constraints imposed on the definition of association between alignment marks 16 and complimentary alignment marks 40. In a most preferred embodiment, a first set of associated alignment mark 16 and complimentary alignment mark 40 from one half of the substrate 10 are composited and presented on the same relative side of the display 56, and a second set of associated alignment mark 16 and complimentary alignment mark 40 from the other half of the substrate 10 are composited and presented on the other relative side of the display 56.

The associated sets of alignment marks are preferably disposed at as great a distance across the substrate 10 from each other as practical, because this tends to provide a more finely tuned ability to precisely align the mask 38 to the substrate 10. This occurs because small rotational errors in alignment in a given direction are magnified as the distance along a line in the direction is increased. Although this tends to improve rotational alignment, alignment in directions orthogonal to the direction are not substantially improved by spacing the associated marks as far apart as possible. Thus, if for some reason rotational alignment is not necessary or desired, then there is no need to space the sets of associated marks as far apart as practical on the substrate 10. Further, if rotational alignment is not necessary or desired, then alignment using more than a single set of associated marks is not particularly beneficial, and only a single set of associated marks need be used.

Movement controls, such as those included in the mask support 42 and the substrate movement controller 34, are used to align the composited images of the alignment marks 16 and the complimentary alignment marks 40 one to another. In the example as started above, this may be accomplished by an operator viewing the images as presented on the display 56. The movement of one or both of the substrate 10 and the mask 38 is a relative movement as between the substrate 10 and the mask 38. Thus, in a first embodiment the substrate 10 is moved while the mask 38 is held in a fixed position, in a second embodiment the substrate 10 is held in a fixed position while the mask 38 is moved, and in a third embodiment both the substrate 10 and the mask 38 are moved, to accomplish the alignment.

It is appreciated that, depending upon which of the components is moving, be it the mask 38 or the substrate 10, others of the components of the apparatus 20 may also preferably be moved in a fixed relationship with the moving element. For example, if the mask 38 is moving, it is preferable that the second sensors 46 move in a fixed relationship with the mask 38, so that the relative known positions of the complimentary alignment marks 40 are not lost. Similarly, if the substrate 10 is moving, it is preferable that the first sensors 28 move in a fixed relationship with the substrate 10, so that the relative known positions of the alignment marks 16 are not lost.

When the images of the associated marks are aligned in the display 56, then the image in the mask 38 is properly aligned to the substrate 10. Further, as this process is repeated for the various mask layers required for the integrated circuit that is formed on the first surface 12 of the substrate 10, all of the various mask layers are properly aligned one to another. At this point, the image on the mask 38 is ready to be projected onto the substrate 10 by the exposure source 50. Further, if the mask 38 is a reticle, the mask 38 is now ready to be stepped across the first surface 12 of the substrate 10 while the exposure source 50 repeatedly projects the image of the mask 38 onto the first surface 12 of the substrate 10.

In the second preferred embodiment of the apparatus 20, the elements 28 are not the sensors as described above, but rather are transmission sources 28 that transmit a form of electromagnetic radiation. The electromagnetic radiation is preferably of a type that penetrates and is transmitted through the substrate 10, at least to a partial extent. Thus, the wavelength of electromagnetic radiation used may depend at least in part upon the material of the substrates 10 to be processed in the apparatus 20. The electromagnetic radiation may include, for example, one or more of visible light, x-ray, infrared, high frequency small wavelength laser, or radio frequency. Depending upon a number of factors, such as the materials used to form the substrate 10, the substrate support 24, and the photoresist on the first surface 12 of the substrate 10, the view ports 26 may or may not be necessary.

It is further preferred that, by a combination of the type and intensity of the electromagnetic radiation used, the alignment marks 16 are projected through the substrate 10 and detected by sensors on the other side of the mask 38. In various embodiments, the second sensors 46 may detect both the alignment marks 16 as projected through the substrate 10 and the complimentary alignment marks 40, and in other embodiments the second sensors detect only the complimentary alignment marks 40 and separate sensors are used to detect the alignment marks 16 as projected through the substrate 10.

The alignment marks 16 are sensed in one embodiment by differences in the intensity of the electromagnetic radiation as it penetrates the different thicknesses of the substrate 10 in those portions of the alignment marks 16 that are etched deeper into the substrate 10. Alternately, the alignment marks 16 are sensed by differences of transmission of the electromagnetic radiation through printed or otherwise applied materials that constitute the alignment marks 16. Regardless of the exact method used, it is appreciated that the images of the alignment marks 16 may be transmitted through the substrate 10 in a variety of ways that can be detected by sensors on the other side of the mask 38.

Most preferably, the electromagnetic radiation so used is not of a wavelength or of an intensity that will substantially effect a photoresist material applied to the first surface of the substrate 10. Thus, there is preferably a difference between the electromagnetic radiation used to project the images of the alignment marks 16 through the substrate 10 and the electromagnetic radiation used to project the image of the mask 38 onto the first surface 12 of the substrate 10.

Once the images of the alignment marks 16 and the complimentary alignment marks 40 are acquired, they are transmitted to the controller 32 and compositor 54, and the mask 38 is aligned to the substrate 10 according to the method as described above. It is also appreciated that an entirely optical method of alignment may be embodied in the apparatus 20, where none of the various images are electronic, but all of the images and the compositing are formed and performed in an optical manner, and the composited images are also viewed optically, such as through a microscope.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. An apparatus for aligning a mask having an image and at least one complimentary alignment mark to a substrate having a first surface and a substantially opposing second surface, the substrate further having at least one alignment mark on the second surface, the apparatus comprising:
    a mask support for supporting the mask in proximity to the first surface of the substrate,
    a substrate support for supporting the substrate with the first surface in proximity to the mask,
    an alignment means for aligning a real time image of the at least one alignment mark on the second surface of the substrate to a real time image of the at least one complimentary alignment mark on the mask,
    an exposure source for projecting the image of the mask onto the first surface of the substrate, and
    a controller for controlling the mask support, substrate support, alignment means, and exposure source.

2. The apparatus of claim 1 wherein the exposure source produces electromagnetic radiation with a wavelength corresponding to at least one of visible light, ultraviolet, x-ray, and laser.

3. The apparatus of claim 1 wherein the alignment means further comprises:
    a first sensor for detecting the at least one alignment mark on the second surface of the substrate and for producing a real time image of the at least one alignment mark, a second sensor for detecting the at least one complimentary alignment mark on the mask and for producing a real time image of the at least one complimentary alignment mark, a compositor for visibly overlaying the real time image of the at least one alignment mark and the real time image of the at least one complimentary alignment mark, and movement controls for moving at least one of the substrate support and the mask support relative to the other and for aligning the real time image of the at least one alignment mark to the real time image of the at least one complimentary alignment mark.

4. The apparatus of claim 1 wherein the alignment means further comprises:

a projection means for projecting a real time image of the at least one alignment mark through the substrate, a sensor for detecting the real time image of the at least one alignment mark projected through the substrate, and also for detecting a real time image of the at least one complimentary alignment mark on the mask, and movement controls for moving at least one of the substrate support and the mask support relative to the other and for aligning the real time image of the at least one alignment mark projected through the substrate to the real time image of the at least one complimentary alignment mark.

5. A method for aligning a mask having an image and at least one complimentary alignment mark to a substrate having a first surface and a substantially opposing second surface, the substrate further having at least one alignment mark on the second surface, the method comprising the steps of:

disposing the mask in proximity to the first surface of the substrate, creating a real time image of the at least one alignment mark, creating a real time image of the at least one complimentary alignment mark, moving at least one of the mask and the substrate relative to the other and aligning the real time image of the at least one alignment mark to the real time image of the at least one complimentary alignment mark, and projecting the image of the mask onto the first surface of the substrate.

6. The method of claim 5, wherein the steps of creating a real time image of the at least one alignment mark and creating a real time image of the at least one complimentary alignment mark further comprise:

detecting the at least one alignment mark on the second surface of the substrate, producing a real time image of the at least one alignment mark, detecting the at least one complimentary alignment mark on the mask, producing a real time image of the at least one complimentary alignment mark, and visibly overlaying the real time image of the at least one alignment mark and the real time image of the at least one complimentary alignment mark.

7. The method of claim 5, wherein the steps of creating a real time image of the at least one alignment mark and creating a real time image of the at least one complimentary alignment mark further comprise:

projecting a real time image of the at least one alignment mark through the substrate, detecting the real time image of the at least one alignment mark projected through the substrate with at least one sensor, and detecting a real time image of the at least one complimentary alignment mark on the mask with the at least one sensor.

* * * * *